(12) United States Patent  
Stenzel

(10) Patent No.: US 8,125,238 B2  
(45) Date of Patent: Feb. 28, 2012

(54) AUTOMATIC TEST EQUIPMENT

(75) Inventor: Adrian Stenzel, Munich (DE)

(73) Assignee: Texas Instruments Deutschland GmbH, Freising (DE)

( * ) Notice: Subject to any disclaimer, the term of this patent is extended or adjusted under 35 U.S.C. 154(b) by 293 days.

(21) Appl. No.: 12/491,065

(22) Filed: Jun. 24, 2009

(65) Prior Publication Data

US 2009/0322372 A1 Dec. 31, 2009

Related U.S. Application Data

(60) Provisional application No. 61/141,892, filed on Dec. 31, 2008.

(30) Foreign Application Priority Data

Jun. 30, 2008 (DE) .......................... 10 2008 031 027

(51) Int. Cl.
*G01R 31/02* (2006.01)
*G01R 31/34* (2006.01)

(52) U.S. Cl. .............................. 324/762.01; 324/765.01

(58) Field of Classification Search .......... 324/533–534, 324/762.01–762.09, 765.01
See application file for complete search history.

(56) References Cited

U.S. PATENT DOCUMENTS 3,480,832 A * 11/1969 Person ............................ 361/56
6,043,660 A * 3/2000 Bahr et al. ..................... 324/380
6,946,829 B2 * 9/2005 Sardat ........................ 324/117 R
2006/0268479 A1 * 11/2006 Bischof ........................... 361/56
2007/0001654 A1 * 1/2007 Newman ....................... 323/235

FOREIGN PATENT DOCUMENTS

GB 1220063 A 5/1972

OTHER PUBLICATIONS

Park, J.; Lee, H.; Anh, M.; Side-Channel Attacks against ARIA on Active RFID Device; International Conference of Convergence Information Technology, 2007.*
Kasper, T.; Embedded Security Analysis of RFID Devices; Ruhr-University Bochum; 2006.*
Office action issued by Deutsches Patent-und Markenamt, dated Mar. 18, 2009, regarding German application No. 10 2008 031 027.1-35.

* cited by examiner

*Primary Examiner* — Huy Q Phan
*Assistant Examiner* — Joshua Benitez
(74) *Attorney, Agent, or Firm* — William B. Kempler; Wade J. Brady, III; Frederick J. Telecky, Jr.

(57) ABSTRACT

A coupling line is provided for coupling a signal generator to a device under test and includes a first Zener diode and a second Zener diode. The first Zener diode and the second Zener diode are coupled in an antiserial manner. They are adapted to couple the signal generator to the device under test when the signal generator is active and decouple the signal generator from the device under test when the signal generator is inactive.

12 Claims, 2 Drawing Sheets

AUTOMATIC TEST EQUIPMENT

FIELD OF THE INVENTION

The invention generally relates to an automatic test equipment. More particularly, the invention relates to a coupling line for coupling a signal generator to a device under test.

BACKGROUND

Integrated circuits, in particular RFID circuits are subject to strict rules for testing. This is particularly the case when such integrated circuits are used in automotive applications, where a high level of safety and security is required. For example, it is often required to subject these circuits to stress testing, wherein a limited number of the device is operated at high temperatures for many hours (e.g., more than several thousand hours) in order to provide a reliable forecast of the aging behavior of the devices of a production cycle over their whole lifetime. However, the peak temperature the devices can withstand is limited. Therefore, the amount of time the devices are to be stressed can not be reduced below a minimum, which provides that a large number of devices are to be stressed simultaneously in order to receive reliable statistic results. Stress testing so many devices at once under harsh conditions is difficult and it is challenging to design test equipment that can cope with these conditions.

Furthermore, some devices under test (DUTs) are envisaged for bidirectional operation or communication; i.e., they can receive and they can transmit signals over the same lines or connections. The stress test should, therefore, be able to handle both directions.

For example, passive RFID transponders are charged during a first charging phase where an RF signal is transmitted from the Read/Write unit to the transponder (downlink). The signal is received through a resonant circuit, which is typically implemented as an LC resonant circuit. The antenna constitutes the inductor (i.e. the L) which is coupled with a capacitor (i.e. the C). One of the components or both, i.e. L and C may be implemented as discrete components, i.e. they are not integrated on the same integrated circuit with other components of the RFID chip. After having received the initial RF signal during the charging phase for a sufficient amount of time, the RFID transponder can start operating from its internal power supply (e.g. a capacitor), which was charged by energy transmitted as an RF signal during the charging phase. The RF signal was rectified and stored as electrical charge on a capacitor. Active RFID transponders may use a battery or the like as a power source and a charging phase may not be required. However, active and passive transponders may use bidirectional signal transfer via the external components, i.e., the LC resonant circuit.

For bidirectional data transmission, an RFID transponder chip is adapted to receive data from a Read/Write unit (downlink) and to transmit data to the Read/Write unit (uplink). An internal clock signal may be used in the RFID transponder chip for performing data processing, control tasks and data transmission, in particular, in during uplink. Therefore, the RFID transponder chips may have an internal oscillation maintenance stage, which establishes and maintains an internal oscillation or clock signal when no external RF signal from a Read/Write unit is present. The oscillation maintenance circuit may use a plucking mechanism in order to maintain the oscillation. The plucking mechanism may periodically couple the LC resonant circuit to ground or a supply voltage in order to supply energy to the LC resonant circuit so as to compensate losses and maintain the oscillation of the LC resonant circuit.

In one known method of stress testing integrated circuits, all the integrated circuits (for example 100 or more) are directly coupled parallel to one signal generator via a transformer. This allows signals from the signal generator to be supplied to the integrated circuits under test. However, in the known method the devices can not transmit signals. The devices under test can only operate in one of the two transmission directions for an integrated circuit (e.g., for an RFID transponder, only in the downlink direction and not in the uplink direction).

Another known method of stress testing is to supply each device by its own transformer. However, for example, for passive RFID transponders with an oscillation maintenance circuit, which is activated after a charging period of the device, it may be necessary to disconnect this signal generator during self-oscillation phases, when the oscillation maintenance circuit will be enabled. Otherwise, the outputs of the devices under test may be shortened by any low impedance of the signal generator output (for example, 50 Ohms). In order to achieve this disconnection, fast analog switches having a modulation frequency (for example, 1 to 2 kHz) for high voltages (around 45 V, for example) are necessary. Additionally, an exact synchronization of the signal generator and the control signal for the analog switches is necessary to prevent over voltage conditions. Furthermore, the analog switches can be damaged due to the harsh conditions of stress testing at high temperatures and thus the devices under test fail the qualification tests, although the failure is due to the switches.

SUMMARY

It is a general object of the invention to provide automatic test equipment that can be used for testing and stressing a device under test, which is configured to send and receive signals.

One aspect of the invention is to provide an improved method of testing a device under test. It is also an object of the invention to provide a method which allows multiple devices under test to be tested and/or stressed at the same time.

Another aspect of the invention is to provide test equipment for stressing and/or testing devices under test, which are adapted to receive and emit signals by use of conventional test equipment without a need for switches.

It is a further aspect of the invention to provide automatic test equipment and methods for testing and/or stressing multiple RFID circuits.

Therefore, an aspect of the invention provides a coupling line for coupling a signal generator to a device under test. In an aspect of the invention, the coupling line comprises a first Zener diode and a second Zener diode. The first Zener diode and the second Zener diode are coupled in an anti-serial manner; i.e., either the anodes or the cathodes of the Zener diodes are coupled to each other, such that, if the coupling line is coupled between the signal generator and the device under test, the first Zener diode is forward biased and the second Zener diode is reverse biased. In an aspect of the invention, the first Zener diode and the second Zener diode are configured so as to pass test signals from the signal generator from the device under test when the signal generator is active and prevent (decouple) signals generated in the device under test from propagating to the signal generator when the signal generator is inactive. The device under test may keep its internal signal alive even when the signal generator is switched off. This is possible as long as the signal from the device under test is smaller (i.e. the signal has a smaller amplitude) than the sum voltage of the two diodes (one in the forward direction and one in the reverse direction). Therefore, no actively switching components are needed for decoupling and coupling the signal generator and the device under test under various different signal conditions.

Using two anti-serially coupled Zener diodes, one in a forward biased direction and one in a reverse biased direction, allows for a simple function test that can be used in production lines and is especially advantageous when used for product testing of integrated circuits. The coupling line of this aspect of the invention thus provides an easy and safe solution for stress testing of devices under test without any active components. Since no active switches or additional external components are required, the invention provides the advantage that all of the components in the circuitry of the coupling line qualify more easily for stress testing at high temperatures, for example up to 125° C. and higher.

In one aspect of the invention, the device further comprises a resistor coupled in parallel with first and second diodes between the signal generator and the device under test. In an aspect of the invention, the device may comprise a capacitor coupled in parallel with the first and second diodes between the signal generator and the device under test. Both the resistor and the capacitor have the effect of limiting the current, for example alternate current, from the signal generator through the coupling line. This means that the current through the current limiting circuitry in the device under test will be limited. Limiting the current through the current limiting circuitry provides the advantage of a defined stress current for the device under test from the voltage generated by the signal generator. Using a capacitor as the current limiter provides an additional advantage of an improved DC decoupling due to its high impedance. If the device under test is, for example, an integrated circuit conceived for RFID tagging and related applications, the device should be able to detect an end of a received signal burst. The current limiting capacitor may then allow an independent operating voltage for each device, which improves end of burst detection (demodulation) of the device under test.

If a capacitor is used to limit the current through the coupling line, the capacitance value of the capacitor may be set in an aspect of the invention so as to achieve a target admittance for a target oscillation frequency of a test signal, such that the capacitance value is equal to the target admittance divided by 2 times pi times the target oscillation frequency.

Advantageously, the coupling line further comprises components which are needed as external components by the device under test. For an RFID chip under test, the coupling line may include a resonant circuit, which can be implemented, for example, as an LC resonant circuit. The resonant circuit can be provided for activating the device under test. During the charge phase of the device under test, and also during downlink bursts, the resonant circuit recovers the signal from the signal generator, which has been biased by the anti-serial arrangement of Zener diodes, back to a sinusoidal signal. When the device under test is tested during downlink pauses and in an uplink phase, the resonant circuit is still connected to the signal source but is decoupled from the switched off signal source by the two anti-serially connected diodes. When the device under test is an RFID integrated circuit, this supports independent self-oscillating of the device under test, supplied by one source, without any active components.

The first and second Zener diodes can be anti-serially coupled with their anodes together. In other words, the Zener diodes can be coupled in a "back-to-back" configuration, with the first Zener diode having its cathode coupled to the device under test and its anode connected to the anode of the other Zener diode, which has its cathode connected to the signal source. In this way, one of the Zener diodes is forward biased and the other reverse biased. The direction of the biasing of the two Zener diodes will depend on the instantaneous polarity of the applied signals.

Advantageously, the device under test is an RFID circuit. The pluck circuit of the RFID integrated circuit will keep the RF resonance from the resonant circuit in the coupling line alive, even when it is decoupled from the signal generator. Each of the RFID integrated circuits may self-oscillate independently, supplied by a single signal generator as a source, without any active components.

The invention also provides an automatic test equipment. In an aspect of the invention, the automatic test equipment includes a signal generator and a coupling line for coupling the signal generator to a device under test. The coupling line comprises a first Zener diode and a second Zener diode. Further, the first Zener diode and the second Zener diode are coupled in an anti-serial manner and are adapted to couple the signal generator to the device under test when the signal generator is active and decouple the signal generator from the device under test when the signal generator is inactive.

If the device under test is an RFID integrated circuit, a typical scenario may be as follows. There is a charge phase during which the RFID device is supplied with energy. During the charge phase and down link bursts, in a first direction, the signal generator is active and transmits energy and optionally also some data to the device under test. Signals from the source will be decreased and biased by the two anti-serial diodes. However, according to an aspect of the invention, the Zener diodes are dimensioned to pass a sufficient portion of the signals so as to stress and test the devices under test. An activation circuit or resonant circuit, which may be included in the coupling line, recovers the biased signal back to a sinusoidal signal. Then, during downlink pauses and in an uplink phase, in the second direction, the signal source is switched off but is still connected. A typical output impendence of an output of a signal generator may be 50 Ohms, for example. Now the signal source is decoupled from the device under test with the two anti-serial diodes. The device under test may keep signals emitted or transmitted to the signal source alive. This is possible as long as the signals (i.e., e.g., the self-oscillating RF signals of an RFID circuit) are smaller than the sum voltage of the two Zener diodes (one in the forward direction and one in the reverse direction).

Furthermore, in an aspect of the invention, the coupling line may be adapted and coupled to decouple the device under test from the switched-off, but connected, signal source without any active switching components. In an advantageous embodiment, the device under test may be an RFID transponder chip and the external components may be an LC resonant circuit. The decoupling circuitry, including the two anti-serial connected diodes requires no active components to disconnect the signal source during down link pauses and the up link phase. No externally controlled analog switches or transistors are required and, furthermore, no directly coupled switches are required (these do not support free oscillation of the device under test).

The invention also provides an automatic test equipment including at least one coupling line implemented in accordance with one or more of the above aspects of the invention. The coupling line includes the two anti-serial Zener diodes.

Therefore, the automatic test equipment of the invention allows the device under test to be fully stress tested, since any circuitry in device under test, which emits or transmits signals or data to the coupling line can operate as provided by the respective application. For example a plucking circuitry in an RFID transponder as device under test will work as in its intended application. In other words, the applicative stimulation of the device under test in qualification tests is improved since the device under test (including e.g. a plucking circuit) may be stressed without using any active components. Furthermore, using two anti-serially coupled Zener diodes, one in a forward biased direction and one in a reverse biased direction, allows for a simple function test that can be used in production lines and is especially advantageous when used for product testing of integrated circuits. The test equipment of the invention thus provides an easy and safe solution for stress testing of devices under test without any active components. Furthermore, the leakage current of the coupling line can be minimized to get a high quality resonant circuit. In addition, the invention provides the advantage that all of the components in the circuit are qualified for stress testing at high temperatures of up to 125° C. and more.

Advantageously, the automatic test equipment may comprise a plurality of coupling lines and a plurality of devices under test. In this case, each coupling line may be adapted to couple a corresponding device under test to the same signal generator. This means that the test equipment of the invention is adapted to be used for multi-channel testing. In other words, a large number of devices under test may be tested simultaneously using only a single signal generator as a signal source.

The invention also provides a method of automatic testing. The method comprises using a coupling line comprising a first Zener diode and a second Zener diode, and coupling the coupling line between a signal generator and a device under test. The first Zener diode and the second Zener diode are coupled in an anti-serial manner.

BRIEF DESCRIPTION OF THE DRAWINGS

Further advantages and characteristics of the invention ensue from the description below of a preferred embodiment, and from the accompanying drawing; in which.

DETAILED DESCRIPTION OF EXAMPLE EMBODIMENTS

Figure 1:
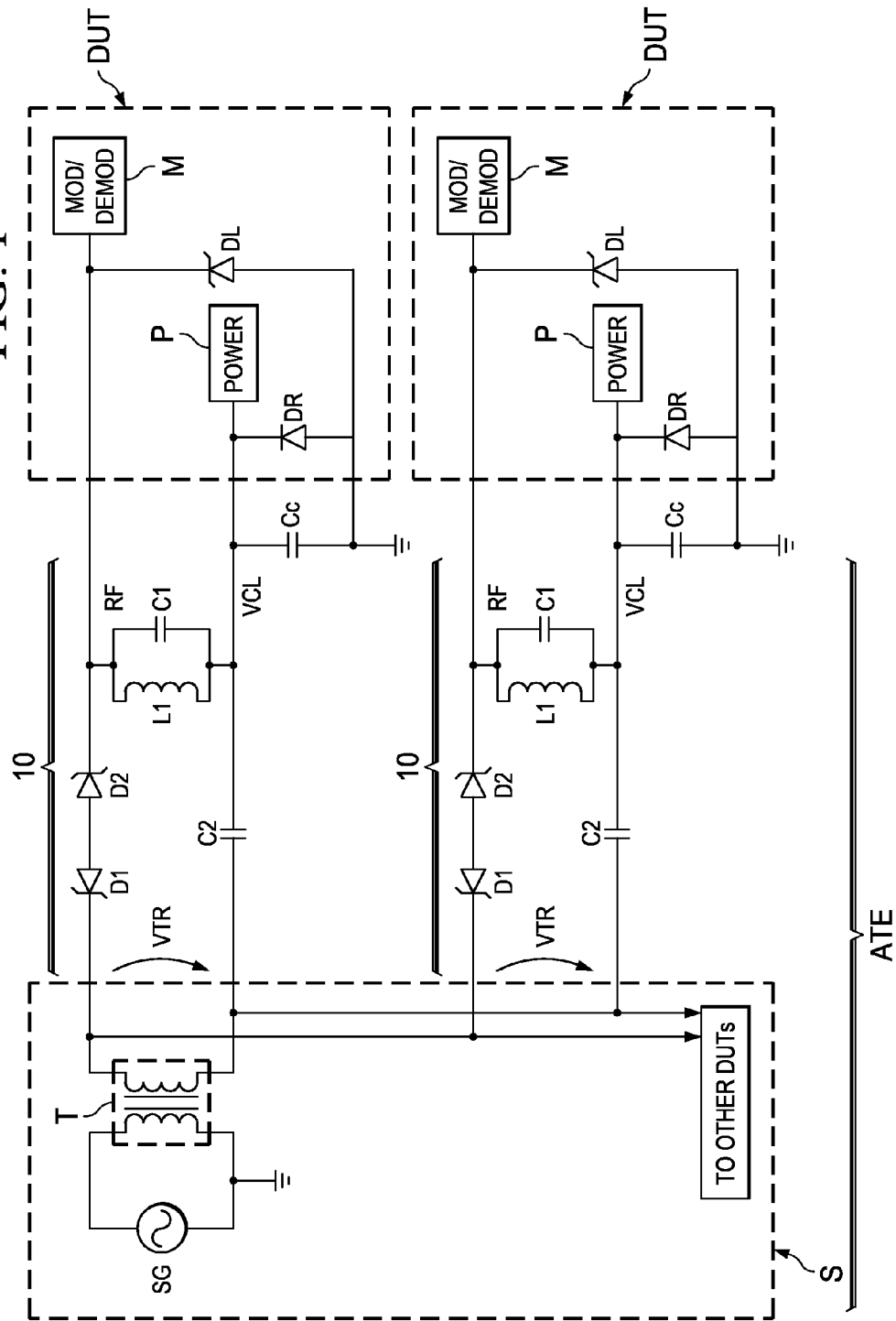
FIG. 1 is a simplified circuit diagram of an automatic test equipment according to an embodiment of the invention.

FIG. 1 shows a simplified circuit diagram of an automatic test equipment ATE according to an embodiment of the invention for coupling a signal source to devices under test. The invention is applicable to devices under test, which receive and produce signals. A typical example of such devices is an RFID transponder device. The invention may advantageously be applied to such RFID transponder devices but may also be applied to other devices.

Just as an example, two identical devices under test DUT are coupled to a signal source S via a corresponding identical coupling line 10. More DUTs may be coupled to the same signal source S as indicated by the lines annotated "TO OTHER DUTs". The coupling line is implemented in accordance with aspects of the invention. The signal source S may include a signal generator SG, which is adapted to provide a sinusoidal RF voltage (alternating voltage) having a frequency of around 134.2 kHz, for example. The signal generator SG may further be adapted to provide very high voltages of approximately 45 V, for example, and may thus be coupled to a transformer T, which is configured to step down the voltage generated by the signal generator SG, for example by a ratio to 10 to 1. The output voltage of the transformer VTR is then supplied to one of the coupling lines 10.

Each coupling line 10 may be provided with parallel rails RF and VCL, with both voltage rails RF and VCL being configured to be coupled to the secondary side of the transformer T and to a corresponding device under test DUT. A standard LC resonant circuit, having an inductor L1 and a capacitor C1 connected in parallel with each other between the voltage rail RF and the voltage rail VCL may be provided in each coupling line 10. A capacitor C2 may be connected between the LC resonant circuit and the signal source S in the voltage rail VCL and a pair of anti-serially connected Zener diodes D1 and D2 may be connected between the LC resonant circuit and the signal source S in the voltage rail RF. The two Zener diodes D1 and D2 can be coupled such that the anodes of the diodes D1 and D2 are interconnected, the cathode of the diode D1 is coupled to the signal source S and the cathode of the diode D2 is coupled to the LC resonant circuit. In other words, in operation of the coupling line 10, one of the diodes D1 or D2 will be forward biased and the other will be reversed biased. Alternatively, the cathodes of the diodes D1 and D2 may be interconnected, with the anodes of the respective diodes D1 and D2 being coupled to the signal source and the resonance circuit.

Although only two devices under test DUT have been shown here as an example, in reality there may be many devices under test being simultaneously stress tested, for example up to about 100, or even more (e.g., 116), devices under test. Each device under test DUT can be coupled to the LC resonant circuit at both the voltage rail RF and the voltage rail VCL by a corresponding coupling line 10. Therefore, there may be as many coupling lines 10 in the automatic test equipment as there are devices under test.

If the devices under test DUTs are RFID transponders, in each device under test DUT, a charge capacitor Cc may be provided, which is coupled to the voltage rail VCL. Optionally, the charge capacitor Cc, the capacitor C1, the inductor L1 and the DUT may be integrated on an integrated circuit. Furthermore, a modulation and demodulation stage M is provided in the DUTs, which is coupled to the voltage rail RF and a power stage P coupled to the voltage rail VCL. Each device under test DUT may further comprise a rectifier diode DR coupled in parallel with the charge capacitor Cc with its cathode to the voltage rail VCL and its anode to ground and a current limiter diode DL coupled with its cathode to the voltage rail RF and its anode to ground.

During simultaneous testing of each device under test DUT, the charge capacitor Cc may first be charged with an RF current from the signal source S in the downlink phase. At this stage the signal source S is active and transmits energy to the device under test DUT via the coupling line 10. The RF signal from the signal source S is decreased by the voltage drop of the two anti-serial Zener diodes D1 and D2. The resonant circuit comprising the inductor L1 and the capacitor C1 can then recover the signal biased by the two anti-serial Zener diodes D1 and D2 back to a sinusoidal wave. The amplitude or maximum voltage of RF signal from the signal source S can be limited through the voltage limiter diode DL (or any limiter stage) if the amplitude of the signal between nodes RF and VCL exceeds a maximum voltage level.

In order to limit the current through the DUT a capacitor C2 (or alternatively a resistor R) may be provided, which may be coupled between node VCL and the transformer T. This provides a DC decoupling for the DUTs at node VCL. In other words, the current limiter implemented by the capacitor C2 can improve the discharge behavior of the RFID circuit when the DUT is an RFID transponder. A resistor may also be used in place of the capacitor C2 for limiting current through the current limiter diode DL, however a capacitor is preferred. This is because the capacitor C2 provides an improved DC decoupling. In order to achieve the same voltage drop as a resistor of admittance G, the admittance of the capacitor C2 should be designed to be approximately equal to G, i.e., 1/2 pi*f C=G. The capacitance value of C2 may be chosen for a specific target frequency, which may be the resonant frequency of the LC resonant circuit. Limiting current through the voltage limiter diode DL, either by use of a capacitor or a resistor, allows the discharge at the voltage rail VCL to be damped, which provides an improved performance of the DUTs, i.e., e.g. an improved end of burst detection (demodulation at the modulation and demodulation stage M).

During downlink pauses and in the uplink phase the signal source S is switched off but is still connected to the coupling line 10, and thus the device under test DUT. However, the signal source is decoupled from LC resonant circuit, and thus the device under test DUT by the two anti-serial Zener diodes. Although the DUT is no longer receiving the RF signal provided by the signal generator SG, the plucking circuit in the RFID circuit in the DUT keeps the RF resonance alive. This is possible without any influence from the signal source S, as long as the amplitude of the self-oscillating RF signal is smaller than the sum of the voltages of the two Zener diodes D1 and D2 (with one being biased in a forward direction and the other being biased in a reverse direction). This means that VDUTmax<VF+VZ, wherein VDUTmax is the maximum amplitude of a signal emitted from the device under test to the coupling line towards the signal source and VF is the voltage drop of a forward biased Zener diode and VR the voltage drop of a reverse biased Zener diode. Furthermore, the resonant circuit comprising the inductor L1 and the capacitor C1 is also decoupled from the switched-off, but connected, signal generator SG without any active switching components.

Figure 2:
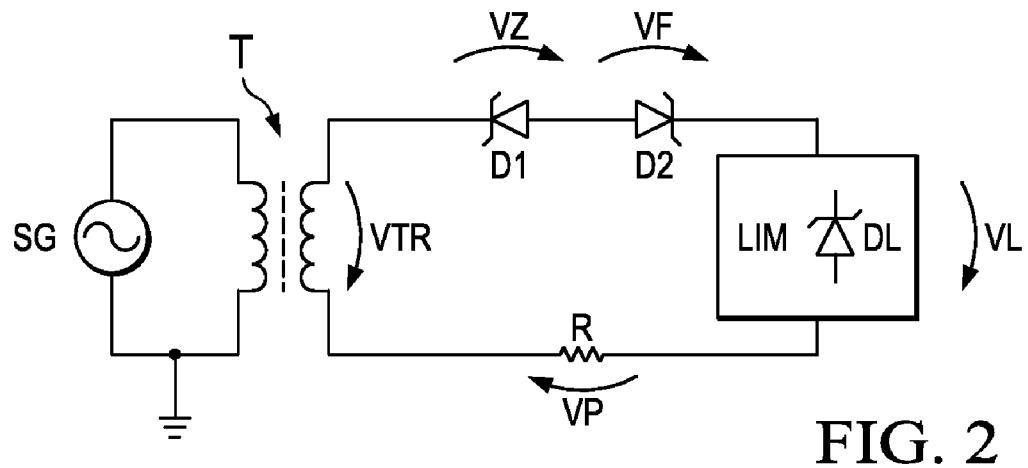
FIG. 2 shows a simplified circuit diagram of a single channel of FIG. 1.

FIG. 2 shows a simplified circuit diagram of a single channel of FIG. 1, where the current limiter capacitor C2 is replaced by a resistor R. If a signal is to be transmitted from the signal generator SG, the voltage VTR supplied from the transformer has to be larger then at least the sum of the voltage VZ across the reverse biased diode D1, the voltage VF across the forward biased diode D2, the voltage VL across the limiter stage LIM and the voltage VP across the resistor R. This provides the following equation: VTR=VZ+VF+VL+VP. If a half wave rectifier is used in the DUT, the voltage drop VR across the rectifier diode DR (shown in FIG. 1) may also be added.

Figure 3:
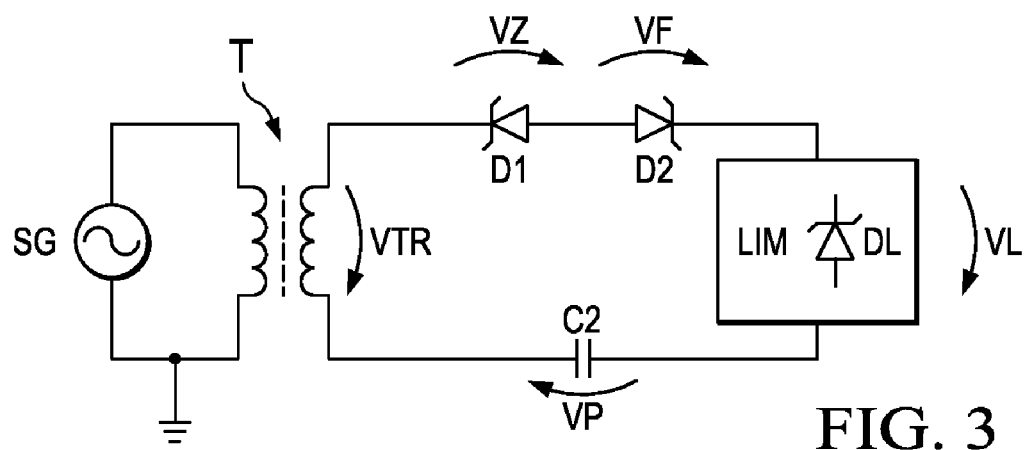
FIG. 3 shows another simplified circuit diagram of a single channel of FIG. 1.

FIG. 3 shows a simplified circuit diagram of a single channel of FIG. 1. The same considerations apply as for FIG. 2 but now a capacitor C2 is used as current limiting element. Therefore, the voltage VP is to be determined as VP=IMAX/(2*pi*f*C2), wherein IMAX is the target maximum current through the DUT, and f is the target frequency. The target frequency f may be the resonant frequency of the resonant circuit including C1, L1 and the input capacitance of the device under test DUT.

As a rule of thumb for dimensioning the Zener diodes D1 and D2, it is to be considered that the signal from the signal generator SG, i.e. the output voltage VTR of the transformer is always damped by VZ+VF. The voltage between nodes VCL and RF (shown in FIG. 1) should not exceed VZ+VF. (However, at downlink, the voltage between the nodes RF and VCL can be higher than VZ+VF, when it reaches the limiter voltage VL).

For the embodiment shown in FIG. 2, the following values may be used VZ=5.6 V, VF=0.7 V and VL=12 V, IMAX=10 mA, VP=4.7 V and R=470Ω. The output voltage of the transformer VTR should then be VTR=23 V. Including a voltage drop VR of, for example, 0.7 V across the rectifier diode DR (shown in FIG. 1), the transformer voltage VTR should amount to at least 23.7 V. For FIG. 3, the capacitor may be chosen in accordance with the target frequency, i.e., for example, the resonant frequency of the resonant circuit L1, C1 shown in FIG. 1.

Although the invention has been described hereinabove with reference to a particular embodiment, it is not limited to this embodiment and no doubt further alternatives will occur to the skilled person that lie within the scope of the invention as claimed.

The invention claimed is:

1. A coupling line for coupling a signal generator to a device under test, the coupling line comprising:
    a first Zener diode;
    a second Zener diode, wherein the first Zener diode and the second Zener diode are coupled in an anti-serial manner and are adapted to pass a signal from the signal generator to the device under test when the signal generator is active and to prevent a signal generated in the device under test from propagating to the signal generator when the signal generator is inactive;
    a capacitor coupled in parallel with the first and second Zener diodes, wherein a capacitance value of the capacitor is set so as to achieve a predetermined admittance for a predetermined oscillation frequency of a test signal, such that the capacitance value is equal to the predetermined admittance divided by 2 times pi times the predetermined oscillation frequency.

2. The coupling line according to claim 1 further comprising a resistor coupled in parallel with the first and second Zener diodes.

3. The coupling line according to claim 2, further comprising a resonant circuit for activating the device under test.

4. The electronic device according to claim 2, wherein the first and second Zener diodes are coupled with their anodes together.

5. The coupling line according to claim 2, wherein the device under test is an RFID circuit.

6. The coupling line according to claim 1, further comprising a resonant circuit for activating the device under test.

7. The electronic device according to claim 6, wherein the first and second Zener diodes are coupled with their anodes together.

8. The coupling line according to claim 6, wherein the device under test is an RFID circuit.

9. The electronic device according to claim 1, wherein the first and second Zener diodes are coupled with their anodes together.

10. The coupling line according to claim 1, wherein the device under test is an RFID circuit.

11. An automatic test equipment for an RFID circuit including a signal generator and a coupling line for coupling the signal generator to a device under test, comprising:
    a plurality of coupling lines each having a first end coupled to a same output of the signal generator and each having a second end coupled to a separate device under test, each coupling line comprising:
    a first Zener diode;

a second Zener diode, wherein the first Zener diode and the second Zener diode are coupled in an anti-serial manner and are adapted to couple the signal generator to the device under test when the signal generator is active and decouple the signal generator from the device under test when the signal generator is inactive, to prevent a signal generated in the device under test from propagating to the signal generator when the signal generator is inactive.

12. A method of automatic testing, comprising:

using a plurality of coupling lines each comprising a first Zener diode and a second Zener diode;

coupling one of the plurality of coupling lines between a same signal generator output and a separate one of a plurality of devices under test, wherein the first Zener diode and the second Zener diode are coupled in an anti-serial manner; and coupling the signal generator to the device under test when the signal generator is active and decoupling the signal generator from the device under test when the signal generator is inactive, to prevent a signal generated in the device under test from propagating to the signal generator when the signal generator is inactive.

* * * * *